July 28, 1931. M. M. PHILLIPS Re. 18,140
WIRELESS RECEIVING CIRCUIT
Original Filed March 20, 1926
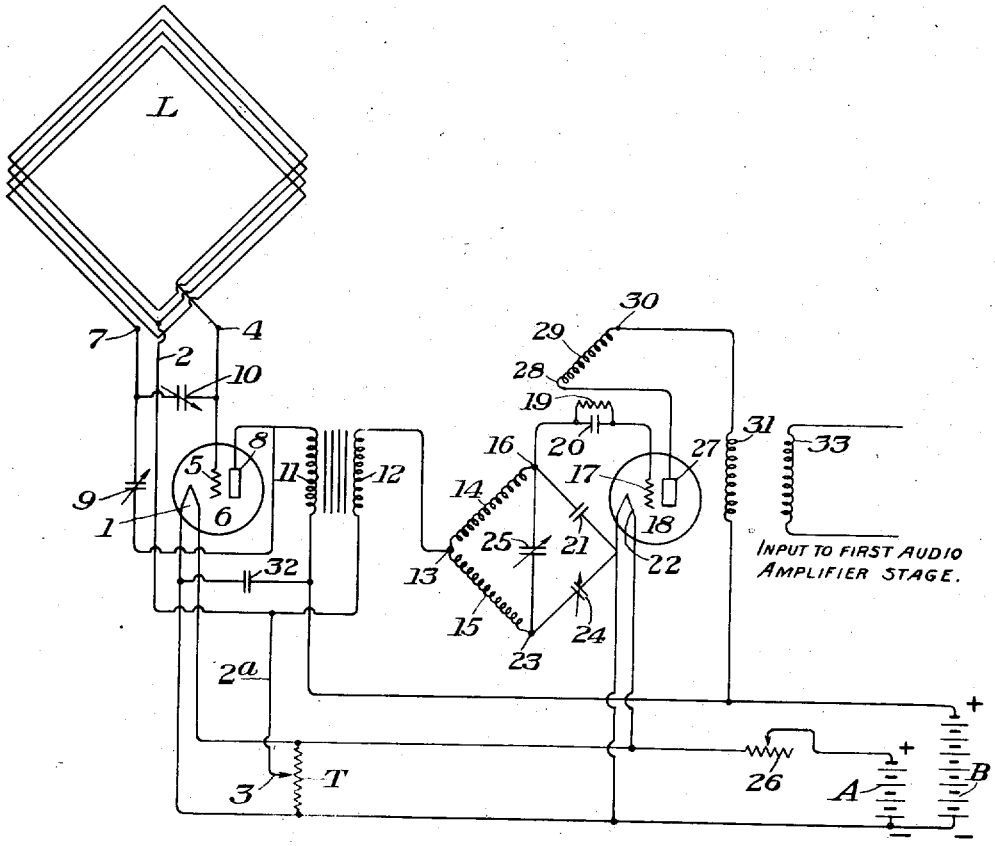
INVENTOR
Maurice M. Phillips
by his attorneys
Byrne, Stetkins, Darnell & Klerk Reissued July 28, 1931

Re. 18,140

UNITED STATES PATENT OFFICE

MAURICE M. PHILLIPS, OF PITTSBURGH, PENNSYLVANIA

WIRELESS RECEIVING CIRCUIT

Original No. 1,674,448, dated June 19, 1928, Serial No. 96,186, filed March 20, 1926. Application for reissue filed April 22, 1930. Serial No. 446,393.

This invention relates to improvements in wireless receiving circuits and more particularly to a circuit employing a vacuum tube detector. According to this invention there is provided a detector circuit of unique design which is preferably used in combination with a collector circuit of the type generally used in a system of tuned radio frequency amplification. The arrangement provided by the circuit is one which will function effectively over the present broadcasting range from 545,000 cycles to 1,500,000 cycles, which is highly selective over the entire range and which is not critical, and therefore well adapted to commercial receiving sets and which will give true reproduction of signals without distortion and without reradiation. According to a preferred embodiment of the invention the circuit, in a general way, includes two bridged circuits and means for coupling these bridged circuits together. One of the bridged circuits includes an inductance, such as a loop, a three-element vacuum tube, a variable capacity for tuning the circuit to carrier frequency, and a variable capacity for balancing or neutralizing the inherent grid-plate capacity of the vacuum tube and the wiring associated therewith. The other circuit, constituting the detector circuit, includes a three-element vacuum tube having a balanced bridge circuit in the grid thereof.

The bridge circuit which operates as the collector circuit is preferably balanced or neutralized in a manner similar to the method disclosed in Hazeltine Patent No. 1,450,080 of March 27, 1923. The coupling device bevice between these circuits which serves to transfer the collected signal impulses from one circuit to the other consists of an aperiodic transformer having an iron core, this transformer, in addition to providing for the transfer of signal energy from the collector circuit to the detector circuit, also constitutes a radio frequency choke in the grid circuit for the detector tube, and as such its provision is extremely important in procuring satisfactory operation of the circuit.

For the purpose of completely disclosing my invention and in order to facilitate its practical application by those skilled in the art, I give below a detailed description of a part of a circuit system embodying this invention, and which may be used with an amplifying channel of any suitable or preferred form.

Referring to the drawings, L constitutes an inductance which may be a loop, similar to the ordinary loop aerial, mounted so as to be capable of being rotated to different positions. It is tapped at its exact center and is connected by means of leads 2 and 2[a] to the center arm of a variable resistance T which is preferably in the form of a potentiometer. This resistance is connected across a battery or other current supply A and serves as a volume control or throttling device.

The tapping of the inductance L at the center divides the inductance into two sections which join at the common lead 2. The other end 4 of one of these inductive arms is connected to the grid 5 of a vacuum tube 6, while the other end 7 of the other inductive arm of the inductance L is connected to the plate 8 of the tube 6 through a variable capacity 9. Variable capacity 9 must be of such value as to be capable of equaling or balancing the inherent capacity existing between the grid 5 and the plate 8 (and the connected wiring) of the vacuum tube 6. Connected across the terminals of the inductance L is a variable capacity 10 of a value suitable for tuning the inductance L.

The variable resistance T which I term the throttle or volume control is connected across the filament battery and conductively couples the bridged collector circuit to the detector circuit through the inductance 12, as hereinafter more fully described. This bridged collector circuit is most sensitive when its grid circuit is negatively biased, and negative biasing is accomplished by swinging the center arm 3 of variable resistance T toward the negative pole of the A battery, as will be well understood by those skilled in the art. In balancing the bridged collector circuit it is highly desirable to swing the center arm 3 to its full negative position. Upon receiving a strong signal from a nearby transmitting station the tendency of the detector circuit to become blocked can be corrected, and as I term it, throttled out, by swinging the arm 3 of the variable resistance 3 toward the positive side of the A battery. This blocking tendency becomes greater as the frequency of the received signal increases, and less as the frequency decreases.

The plate 8 of the tube 6 is connected to one end of an inductance 11, the other end of the inductance being connected to the positive side of a battery B, which is utilized to supply current to plate 8. The inductance 11 preferably constitutes the primary winding of an iron core aperiodic radio frequency coupling transformer so designed as to be suitable for present day broadcasting reception. The inductance 12 constitutes the secondary winding of said coupling transformer. As hereinbefore pointed out, one side of the winding 12 is connected to the wire 2—2ª. The other end of this winding connects at 13 to the balanced input circuit for the grid. This balanced circuit comprises two inductive arms 14 and 15 with the input from the inductance 12 connected at the central or junction point. The inductances 14 and 15 may be provided by tapping a toroidal form of a coil at a central point 13. The end 16 of inductive arm 14 is shown connected to the grid 17 of a three-element vacuum tube 18 through a suitable resistance 19 and capacity 20 (preferably 100,000 ohms and .00025 microfarad respectively). The outer end 16 of inductive arm 14 is also connected through a fixed capacity 21 to the negative side of the filament 22 of the vacuum tube 18.

The outer end 23 of the inductive arm 15 is connected to the negative side of filament 22 through a variable capacity 24 of a suitable value. The value of the fixed capacity 21 is preferably of the order of .00008 microfarad and the value of the variable capacity 24 is preferably of the order of .000045 microfarad. A variable capacity 25 is connected across inductive arms 14 and 15 and serves to tune the input circuit for the tube 18. Its capacity is such as to tune the inductive arms 14 and 15.

It will be seen that this arrangement is quite similar to a Wheatstone bridge circuit having two inductive arms and two capacity arms with the capacity 25 connected across the bridge.

The filaments 22 and 1 of the vacuum tube 18 and vacuum tube 6, respectively, are connected across battery A through a variable resistance 26. The plate 27 of the vacuum tube 18 is connected to one end 28 of an aperiodic coil 29 inductively coupel to one of said inductance arms 14 or 15. The other end 30 of coil 29 is connected to one end of an inductance 31 which forms the output circuit of the detector tube 18. This inductance 31 may comprise a part of any suitable amplifying channel. Due to a peculiarity of the detector circuit, the amplifying channel may be similar to the intermediate amplifying channel commonly employed in a superheterodyne circuit, in which case the inductance 31 is the primary of an air core coupled aperiodic transformer whose secondary is the inductance 33. The other end of inductance 31 is connected to the positive side of battery B.

I have shown a by-pass condenser 32 in the plate filament circuit of the tube 6 which provides a plate-to-ground filter.

While the capacities 9 and 24 have been described as variable capacities, these capacities are only adjusted to the initial requirements of the circuit, and in the subsequent use of the circuit variation of these capacities is not required except such adjustment as may be necessary from time to time to take care of other variations in the circuit.

I have found that if a telephone or other translating device be included in circuit with the plate 27 of the tube 18, a clear, sharp signal may be heard. It will be observed that the winding 12 of the aperiodic transformer having an iron core in effect provides a radio frequency choke in the circuit between the line 2ª and the mid point 13 of the balanced grid inductance of the tube 18. I have found that if this choke is not provided the detector does not effectively function to produce a clear audible signal. By reason of the feed-back coupling between the coil 29 and the inductance 14 a condition favorable to regeneration is established, but due to the balanced bridge in the grid circuit this regeneration or feed-back is automatically controlled at all frequencies over which the set operates and under all conditions of operation, so that whistling or howling cannot result, or signal distortion cannot obtain, and absolute stability in the operating characteristic of the circuit is maintained at all times. This is an inherent feature in the circuit disclosed. Moreover, this detector circuit has the inherent peculiarity that as the frequency of the received signal increases the tuning thereof broadens, which is just the reverse of the condition which obtains in the radio frequency amplifying circuit which precedes it. This inherent peculiarity of the detector circuit is a highly desirable feature when used in combination with the radio frequency amplifying stage, because of the fact that while the radio frequency amplifying stage does not separate stations, i. e., tune so sharply, at the higher frequencies, the detector circuit does tune more sharply and one circuit has a compensating effect upon the other. The circuit provides the high selectivity of a superheterodyne circuit with the stability and noncritical characteristics of an ordinary tuned radio frequency amplifying circuit, thereby making the circuit highly satisfactory from a commercial standpoint due to the ease with which it may be tuned.

Having thus described my invention, what I claim as new and desire to secure by Letters Patent is:

1. A circuit system comprising a bridged collector circuit which includes two inductive arms, a three-element vacuum tube and a capacity for balancing the inherent grid plate capacity of said tube, a second bridged circuit which includes two inductive and two capacity arms and a three-element vacuum tube and two inductances magnetically coupled together and conductively coupled to said circuits.

2. A circuit system comprising a directional bridged collector circuit, which includes a directional loop, a three-element vacuum tube and a variable capacity for balancing the inherent grid plate capacity of said tube, a second bridged circuit which includes two inductive and two capacity arms and a three-element vacuum tube which functions as a detector, and two inductances magnetically coupled together and conductively coupled to said circuits.

3. In a radio receiving circuit, a detector tube having a filament, a grid and a plate, a bridge in the grid circuit having two inductive arms and two capacity arms, a tuning condenser across the bridge, and an inductance in circuit with the plate inductively disposed in the field of one of the inductances of the bridge circuit.

4. In a radio receiving circuit, a detector tube having a filament, a grid and a plate, a bridge in circuit with the grid having an inductance side with two inductances therein, a capacity side with two capacity arms therein, the capacity side being connected between the two capacity arms with the filament, and a variable capacity across the bridge between the inductance side thereof and the capacity side thereof, the grid being connected to a point of juncture between the capacity side and the inductance side.

5. In a radio receiving circuit, a detector tube having a filament, a grid and a plate, a bridge in circuit with the grid having an inductance side with two inductances therein, a capacity side with two capacity arms therein, the capacity side being connected between the two capacity arms with the filament, a variable capacity across the bridge between the inductance side thereof and the capacity side thereof, the grid being connected to a point of juncture between the capacity side and the inductance side, and an inductance in circuit with the plate inductively arranged with reference to one of the inductance arms of the bridge, and a signal input circuit to the bridge.

6. In a radio receiving circuit, a detector tube having a filament, a grid and a plate, a bridge in circuit with the grid having an inductance side with two inductances therein, a capacity side with two capacity arms therein, the capacity side being connected between the two capacity arms with the filament, a variable capacity across the bridge between the inductance side thereof and the capacity side thereof, the grid being connected to a point of juncture between the capacity side and the inductance side, and an inductance in circuit wth the plate inductively arranged with reference to one of the inductance arms of the bridge, and a signal input circuit to the bridge, said signal input circuit including a radio frequency choke.

7. In a circuit of the class described, a detector comprising a tube having a hot cathode, a grid and a plate, a bridge circuit comprising an inductance side having two inductance arms and a capacity side having two capacity arms, each of the capacity arms being connected with the cathode of the tube, a tuning condenser connected across the bridge between the inductance side thereof and the capacity side thereof, a connection between the grid of the tube and the bridge, said connection leading to a point of juncture between the inductance side and the capacity side, and a feed-back circuit from the plate of the detector tube to the bridge circuit.

8. In a radio receiving circuit of the class described, a detector tube having a cathode, a grid and a plate, a balancing bridge having an inductance side with two inductive arms, a capacity side with two capacity arms, each of the capacity arms being connected with the cathode of the detector tube, a variable tuning condenser across the bridge between the inductance side and the capacity side thereof, a grid input connection from the grid of the detector tube to a point of juncture between the capacity side and the inductance side of the bridge, a tuned radio frequency amplifying circuit including a three-element tube having a cathode, a grid and a plate, an iron core transformer between the plate of the radio frequency amplifying stage and the balancing bridge, said radio frequency transformer having a secondary winding one side of which is connected to the cathode circuit of the radio frequency amplifying tube and the other side of which connects to the grid of the detector tube through said balancing bridge.

9. In a radio receiving circuit of the class described, a detector tube having a cathode, a grid and a plate, a balancing bridge having an inductance side with two inductive arms, a capacity side with two capacity arms, each of the capacity arms being connected with the cathode of the detector tube, a variable tuning condenser across the bridge between the inductance side and the capacity side thereof, a grid input connection from the grid of the detector tube to a point of juncture between the capacity side and the inductance side of the bridge, a tuned radio frequency amplifying circuit including a three-element tube having a cathode, a grid and a plate, an iron core transformer between the plate of the radio frequency amplifying stage and the balancing bridge, said radio frequency transformer having a secondary winding one side of which is connected to the cathode circuit of the radio frequency amplifying tube and the other side of which connects to the grid of the detector tube through said balancing bridge, and a feed-back connection in the plate circuit of the detector tube to one of the inductance arms of the balanced bridge circuit.

10. In a radio receiving circuit, a detector tube, an inductance having one end thereof connected to the grid of the tube and having its other end connected to the grid of the tube through a condenser, a tuning condenser connected across the inductance, a signal input connection at a mid-point of the inductance, and a circuit including a radio frequency choke connecting the signal input connection to the cathode of the tube.

11. In a radio receiving circuit, a detector tube, an inductance having one end thereof connected to the grid of the tube and having its other end connected to the grid of the tube through a condenser, a tuning condenser connected across the inductance, a signal input connection at a mid-point of the inductance, and a circuit including a radio frequency choke connecting the signal input connection to the cathode of the tube, the plate circuit of the tube including a feed-back inductance and a source of plate current of a potential of approximately fifteen volts.

12. In a radio receiving circuit, a detector tube, an inductance having one end thereof connected to the grid of the tube and having its other end connected to the grid of the tube through a condenser, a tuning condenser connected across the inductance, a signal input connection at a mid-point of the inductance, and a circuit including a radio frequency choke connecting the signal input connection to the cathode of the tube, the plate circuit of the tube including a feed-back inductance and a source of plate current of a potential not substantially exceeding fifteen volts.

13. In a radio circuit, a detector tube having a cathode, a plate and a grid, a balancing circuit comprising an inductance side having two arms and a capacity side having two arms, the two arms of the capacity side being connected to the cathode of the tube, the grid of the tube connecting to a point of juncture of the capacity side and the inductance side of the bridge, a tuning condenser connected across the bridge in parallel with the inductance side, and a connection from the cathode of the tube to the inductance having a radio frequency choke therein.

14. In a radio circuit, a detector tube having a cathode, a plate and a grid, a balancing circuit comprising an inductance side having two arms and a capacity side having two arms, the two arms of the capacity side being connected to the cathode of the tube, the grid of the tube connecting to a point of juncture of the capacity side and the inductance side of the bridge, a tuning condenser connected across the bridge in parallel with the inductance side, a connection from the cathode of the tube to the inductance having a radio frequency choke therein, and a feed-back inductance from the plate of the detector tube to an inductance arm of the bridge input circuit.

15. In a radio circuit, a detector tube having a cathode, a plate and a grid, a balancing circuit comprising an inductance side having two arms and a capacity side having two arms, the point of juncture of the two arms of the capacity side being connected to the cathode of the tube, the grid of the tube connecting to a point of juncture of the capacity side and the inductance side of the bridge, a tuning condenser connected across the bridge in parallel with the inductance side, and a connection from the cathode of the tube to the inductance having a radio frequency choke therein, said connection from the cathode of the detector tube to the inductance connecting to the mid-point of the inductance side of the bridge.

16. In a radio receiving circuit, a detector tube having a cathode, a grid and a plate, a bridge circuit comprising an inductance, a connection between one end of the inductance and the cathode of the tube having a capacity therein, a connection between the other end of the inductance and the cathode of the tube having a capacity therein, a tuning condenser connected across the inductance, a connection between one end of the inductance and the grid, an inductance coupling connecting the inductance and the cathode said coupling having an iron core inductance therein constituting a radio frequency choke, a plate circuit for the detector tube including a feed-back coupling from the plate circuit to said bridge circuit, and an input connection to the first mentioned inductance.

In testimony whereof I have hereunto set my hand.

MAURICE M. PHILLIPS.